United States Patent [19]
Farrar

[11] Patent Number: 6,136,689
[45] Date of Patent: *Oct. 24, 2000

[54] METHOD OF FORMING A MICRO SOLDER BALL FOR USE IN C4 BONDING PROCESS

[75] Inventor: Paul A. Farrar, South Burlington, Vt.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/134,363

[22] Filed: Aug. 14, 1998

[51] Int. Cl.[7] ...................... H01L 21/4763; H01L 21/675
[52] U.S. Cl. .......................... 438/626; 438/632; 438/675
[58] Field of Search .................................. 438/612, 613, 438/626, 632, 633, 637, 675

[56] References Cited

U.S. PATENT DOCUMENTS

| | | |
|---|---|---|
| 4,532,002 | 7/1985 | White . |
| 4,606,998 | 8/1986 | Clodgo et al. . |
| 5,457,345 | 10/1995 | Cook et al. . |
| 5,667,132 | 9/1997 | Chirovsky et al. . |
| 5,691,239 | 11/1997 | Hakey et al. . |
| 5,762,259 | 6/1998 | Hubacher et al. . |
| 5,786,270 | 7/1998 | Gorrell et al. . |
| 5,838,069 | 11/1998 | Itai et al. . |
| 5,866,475 | 2/1999 | Yanagida . |

OTHER PUBLICATIONS

Soller et al., A flexible multi–layer resist system using low temperature plasma–deposited silicon nitride, Journal of the Electrochemical society, vol. 131, No. 4 p. 868–72, Apr. 1984.

*Primary Examiner*—Richard Booth
*Assistant Examiner*—Ron Pompey
*Attorney, Agent, or Firm*—Dickstein Shapiro Morin & Oshinsky LLP

[57] ABSTRACT

A method of forming micro solder balls for use in a C4 process is described. The solder balls are formed by laying down a peel-away photoresist layer, forming holes in the photoresist layer to expose electrical contacts, depositing a solder layer over the photoresist, forming solder areas in the holes and then, using a tape liftoff process to remove the solder layer and photoresist layer while leaving solder areas in the holes. The solder areas are then heated to allow solder balls to form.

47 Claims, 8 Drawing Sheets

METHOD OF FORMING A MICRO SOLDER BALL FOR USE IN C4 BONDING PROCESS

BACKGROUND OF THE INVENTION

1. Field of the Invention

The invention relates to a method of forming micro solder balls for bonding integrated circuits to a module substrate or to a circuit board, using a C4 bonding process. In particular, there is described a method for forming micro solder balls by a tape liftoff process which allows for an increased number and density of input/ouput connections to be fabricated on each integrated circuit chip, module substrate or circuit board.

2. Description of the Related Art

The central processing units (CPUs) of most modern day computers are typically provided on large circuit boards (mother boards) populated with various integrated circuit (IC) chips, such as microprocessor chips and memory chips. These IC chips work in conjunction with one another to perform the functions of the computer. Contacts on the mother board are connected to contacts on the IC chips by the use of multi-chip modules or directly by conventional means, such as solder. The chips are connected to one another by metal patterns formed on the surface of the module or the substrate mother board. These metal patterns provide a conduit for data exchange between the IC chips.

There is a constant need for computers which operate at faster rates. In order to accommodate this need, various techniques have developed to increase the rate (bandwidth) at which data can be processed and transmitted. One of these involves increasing the circuit complexity of IC circuits which also often results in a larger package for the IC chip and an increase in the number of input/output (I/O) terminals for chip. Since the amount of data that can be accessed from or transferred to an IC chip is directly proportional to the number of I/O lines the chip contains, increasing the number of I/O terminals directly increases data transfer and processing speed.

IC chips have traditionally been packaged in modules before they are bonded to a mother board or other circuit board. The module consists of one or more IC chips bonded to a module substrate. The composite IC chip-module substrate is then bonded to a computer mother board or other circuit board. Although this is the traditional method of attachment, recently IC chips have also been directly bonded to mother boards.

Traditionally, IC chips were connected to the first level metal pattern on a module substrate with fine wires (wire bonding). This method of connection was limited by the number of pads which could be placed on the periphery of the IC chip. Since then, considerable progress has been made in reducing the IC chip pad size, thereby increasing the number of pads. However, this technology is still limited by the number of pads which can be formed on the chip periphery, and therefore the number of I/Os on a chip is likewise limited. Therefore, other techniques have been developed over the past 30 years to increase the number of available I/O terminals and eliminate alignment problems.

One of these techniques, known as Controlled Collapse Chip Connection (C4), was developed in the 1960s to deal with the problems associated with alignment of integrated circuit chips on a substrate of a module. This process also sought to increase the number of available I/O terminals which could be available for each IC chip. The C4 process uses solder bumps deposited on flat contacts on the IC chips to form the bond between the IC chip and the module substrate. The contacts and solder balls on the IC chips are matched with similar flat contacts on the module substrate to form the connection. Once the chip is placed on top of the contacts of the module substrate, the entire device is heated to a temperature which melts the solder. Then, the solder is allowed to set, and a reliable bond is formed between the chip and the module substrate. Although the C4 bonding process is usually employed to bond an IC chip to a module substrate, it can also be used to bond an IC chip directly to a mother board or other circuit board.

One of the main advantages of this process is that the IC chip self-aligns itself on the module substrate based on the high surface tension of the solder. In other words, the chip need not be perfectly aligned over the contacts of the substrate, as long as it is in close proximity the melting of the solder will align the chip with the substrate contacts. The other advantage of this process is that an increased number of I/O terminals can be fabricated for each IC chip. This type of bonding process is also often referred to as "flip-chip", or "micro-bump" bonding. The process can be briefly explained with reference to FIGS. 1 and 2.

FIG. 1 shows a side view of a IC chip 10 and a module substrate 20. The IC chip 10 is fabricated with various metal pattern lines and contacts 50 imprinted on its last metal level, as shown in FIG. 2. Formed beneath the IC chip 10 is an array of solder balls 30. The module substrate 20 includes metallized paths 60 for carrying signals from the IC chip 10 to other elements mounted on the substrate. These paths have contacts which match the contacts located on the underside of the IC chip 10. When the IC chip 10 is ready to be mounted, it is placed on top of the module substrate 20 above the substrate contacts with the solder balls 30 attached to the contacts of the IC chip resting on the contacts of the module substrate, as shown in FIG. 1. When the device is heated, the solder melts and the chip 10 self-aligns with the module substrate contacts. The solder later hardens to form a reliable bond between the two sets of contacts. FIG. 3 shows the device after the solder has been heated and set. The completed module is then bonded to a mother board (not shown) through wire bonds or additional C4 connections at the module terminals.

Traditionally, the contacts and solder balls have been formed on the IC chip using metal mask technology. In this process a metal mask (essentially a metal plate with a pattern of holes therein) is placed over an IC wafer containing many IC chips 20 for forming the contacts and solder balls. Then, contact material and solder are evaporated through the holes onto the wafer. The holes in the metal masks must be of sufficient size to prevent warpage and damage of the mask during use. Hence, the number of contacts that can be fabricated through use of a metal mask is limited because the holes in the mask must remain above a minimum size to prevent these problems. Consequently, the size of the solder balls that can be created is similarly limited.

The minimum diameter of a C4 solder ball that can be achieved using current techniques, such as metal mask, is approximately 100 microns. Since the size of the solder balls is directly related to the number and density of I/O terminals that can be fabricated on a given IC chip, a decrease in solder ball size would provide for an increase in the number and density of the I/O terminals. This would, in turn, allow for a significant increase in data transmission rates because of the increased number of I/O ports for the packaged IC circuit.

Hence, there is currently a need for a process for forming C4 solder balls which are less then 100 microns in diameter.

SUMMARY OF THE INVENTION

The present invention provides an improved method for forming solder balls used in a C4 bonding process. The present inventor has discovered that by using a tape liftoff process to form the solder contacts, significantly smaller contacts can be easily formed on an IC chip.

The invention is a method of fabricating contact terminals and solder balls on an IC chip. The fabrication utilizes a tape liftoff process to remove unwanted solder and photoresist. Use of the tape liftoff process allows formation of solder balls which are at least two orders of magnitude smaller than prior art solder balls.

Although initially envisioned for use as a replacement for the presently used processes for forming C4 type connections on IC chips, the same process of the invention can also be used to form solder ball connections on module substrates or circuit board substrates.

The above and other advantages and features of the present invention will be better understood from the following detailed description of the preferred embodiment of the invention which is provided in connection with the accompanying drawings.

DETAILED DESCRIPTION OF THE PREFERRED EMBODIMENTS

The present inventor has discovered that by using a tape liftoff process for screening solder balls onto a substrate, the size of the solder balls can be significantly decreased. The process described below can be used to deposit solder balls on an IC chip, a module substrate, a circuit board, or any similar substrate. Tape liftoff processes, per se, are known in the art, as evidenced by U.S. Pat. No. 5,240,878 to Fitzsimmons, which is incorporated herein by reference. Tape liftoff processes are frequently used to remove unwanted photoresist levels once an imaging and etching has taken place.

The process of the invention is explained below with reference to FIGS. 4A–4Q. Although the following explanation refers to a technique for placing solder balls on a wafer, those skilled in the art will recognize that the process described below can be performed on a single chip. Further, it will also be apparent to those skilled in the art that the process described below can be used to form solder balls on a module substrate or a circuit board (e.g. a computer mother board).

Figure 4A:
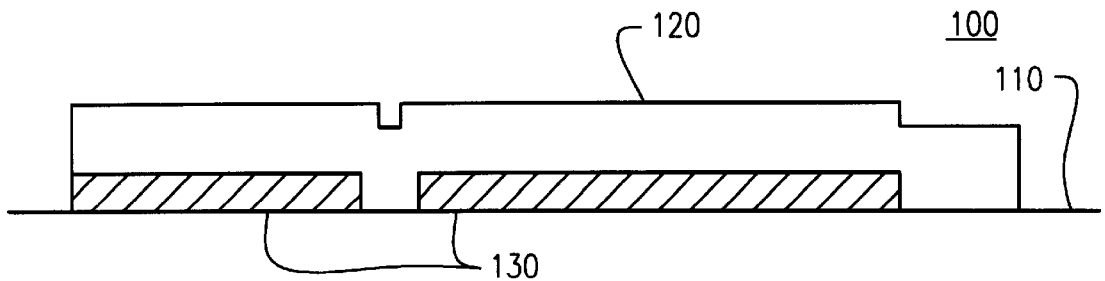
FIGS. 4A–4Q show cross-sectional views of a structure fabricated in accordance with the method of the present invention.
Figure 4B:
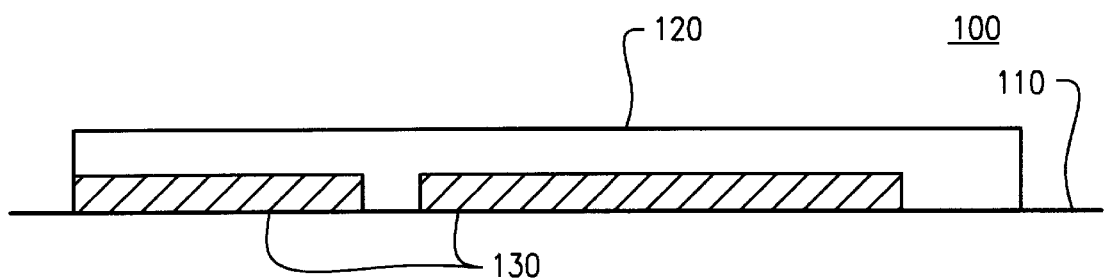
Figure 4C:
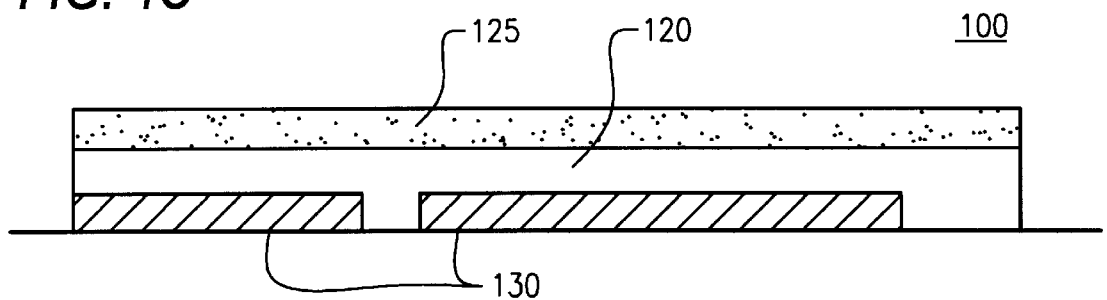
Figure 4D:
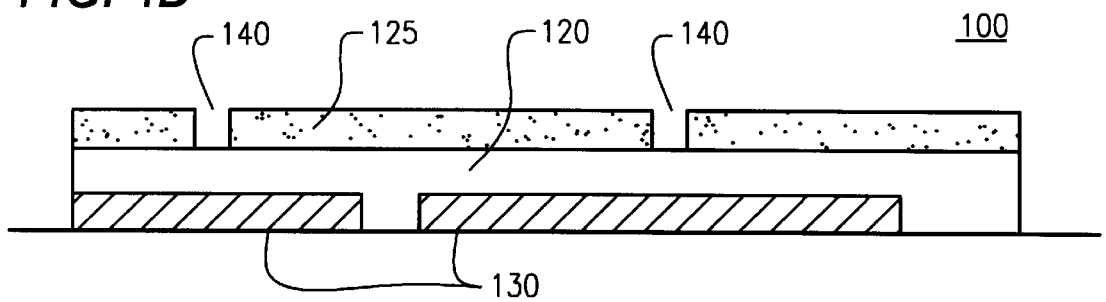
Figure 4E:
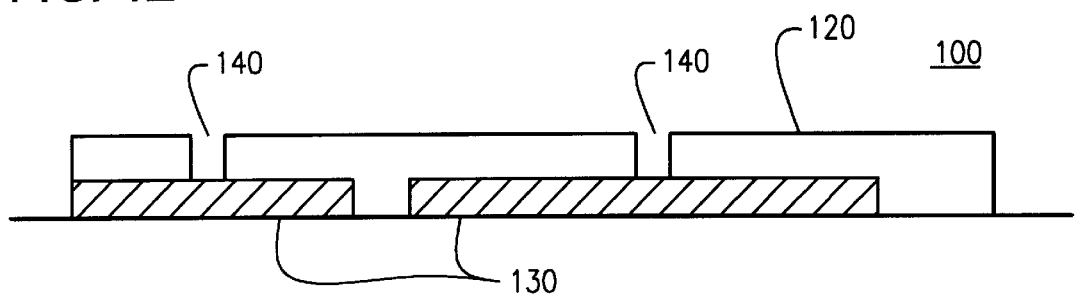
Figure 4F:
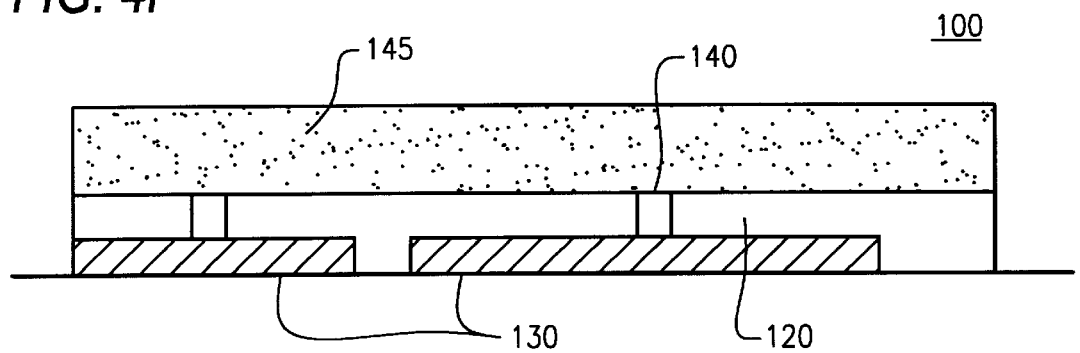
Figure 4G:
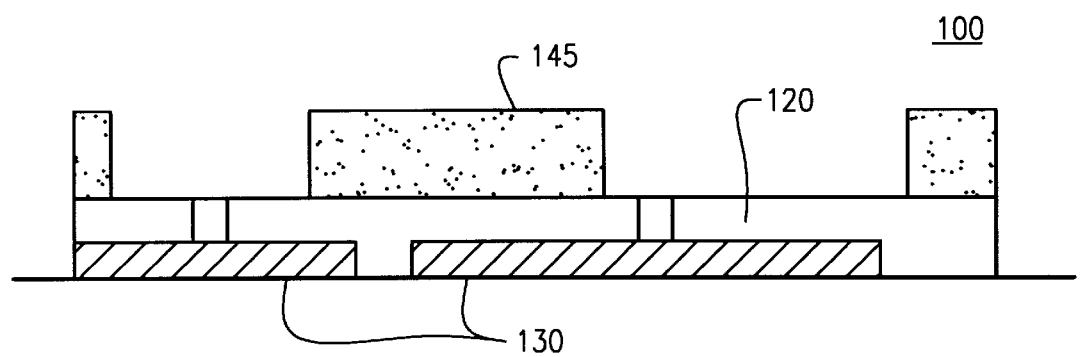
Figure 4H:
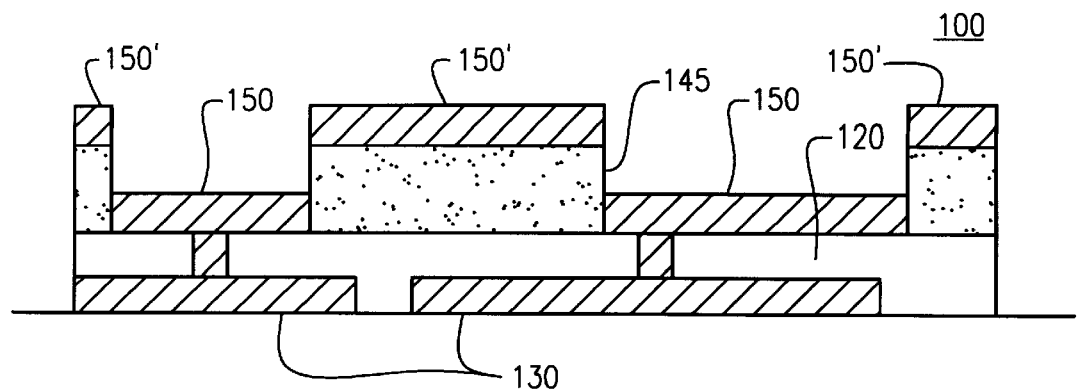
Figure 4I:
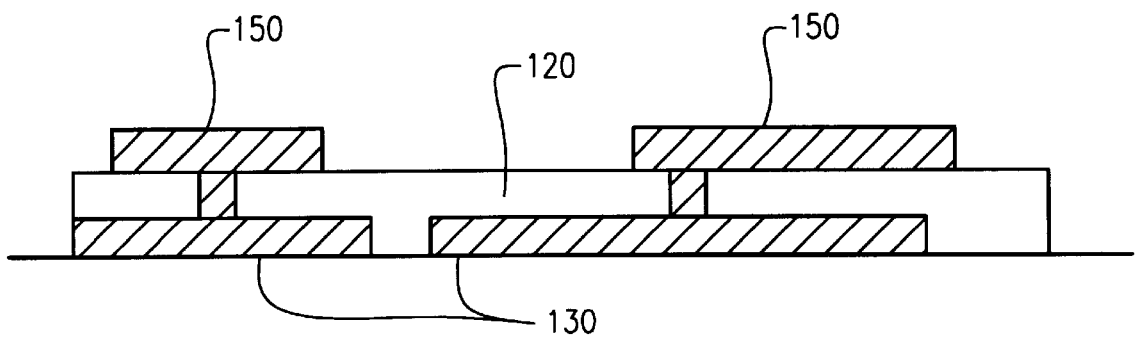
Figure 4J:
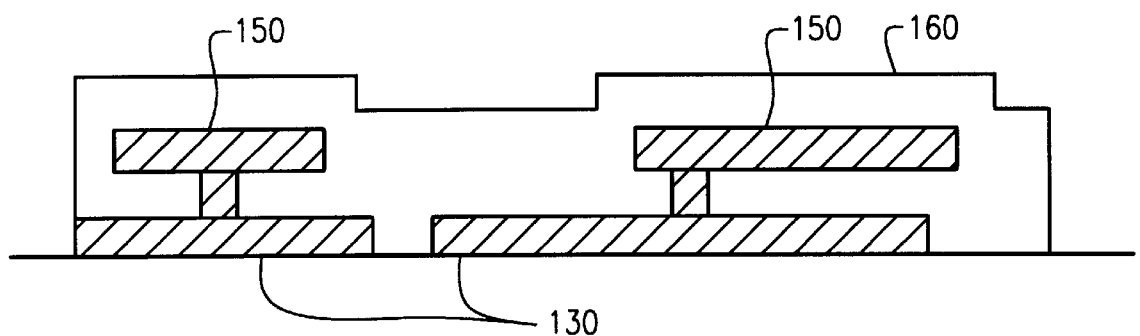
Figure 4K:
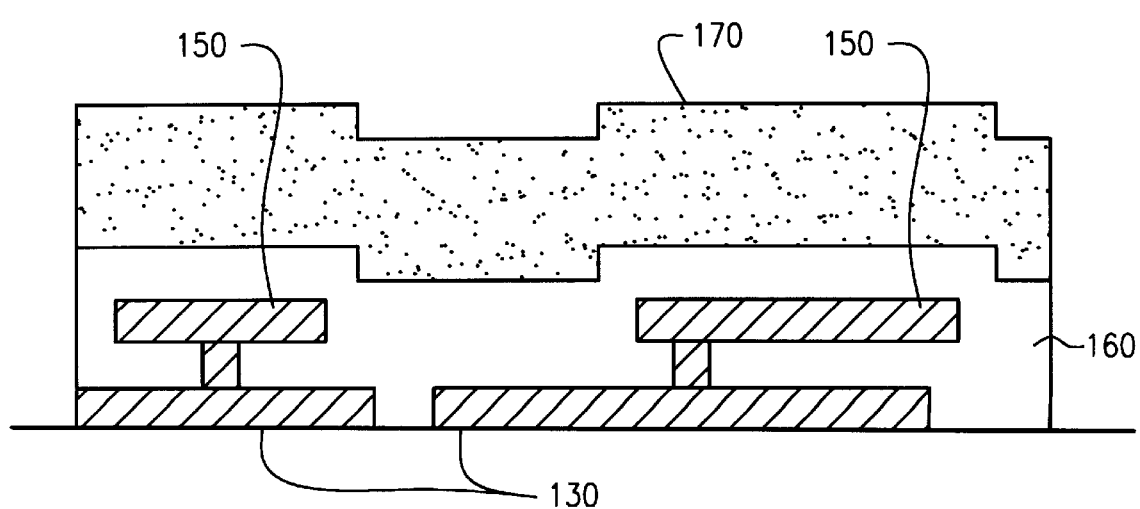
Figure 4L:
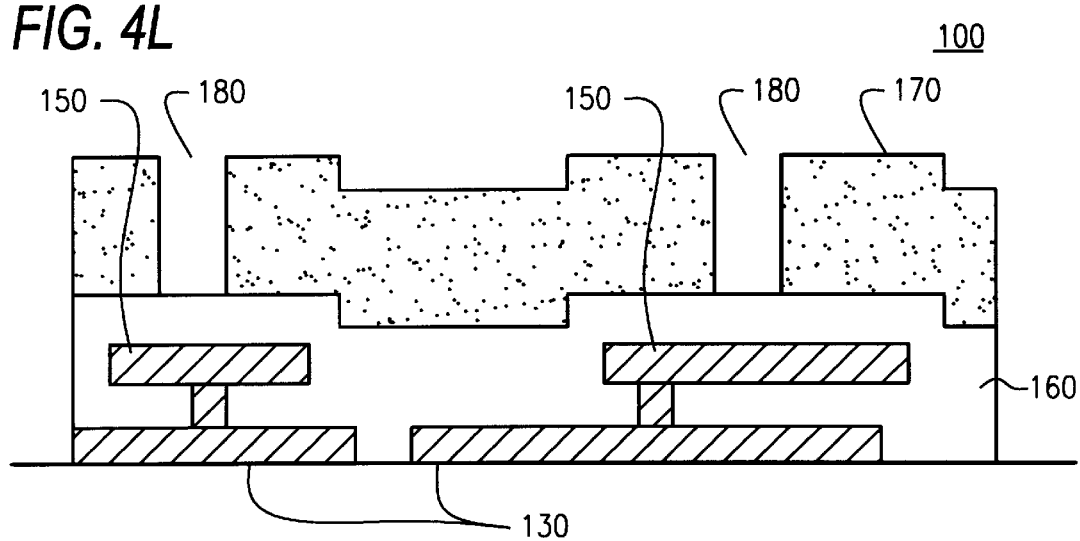
Figure 4M:
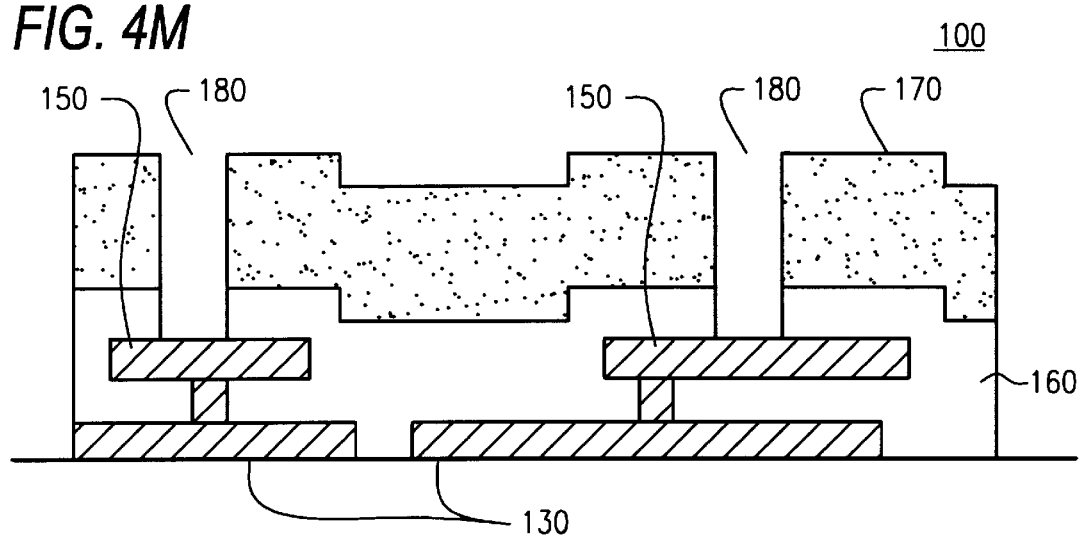
Figure 4N:
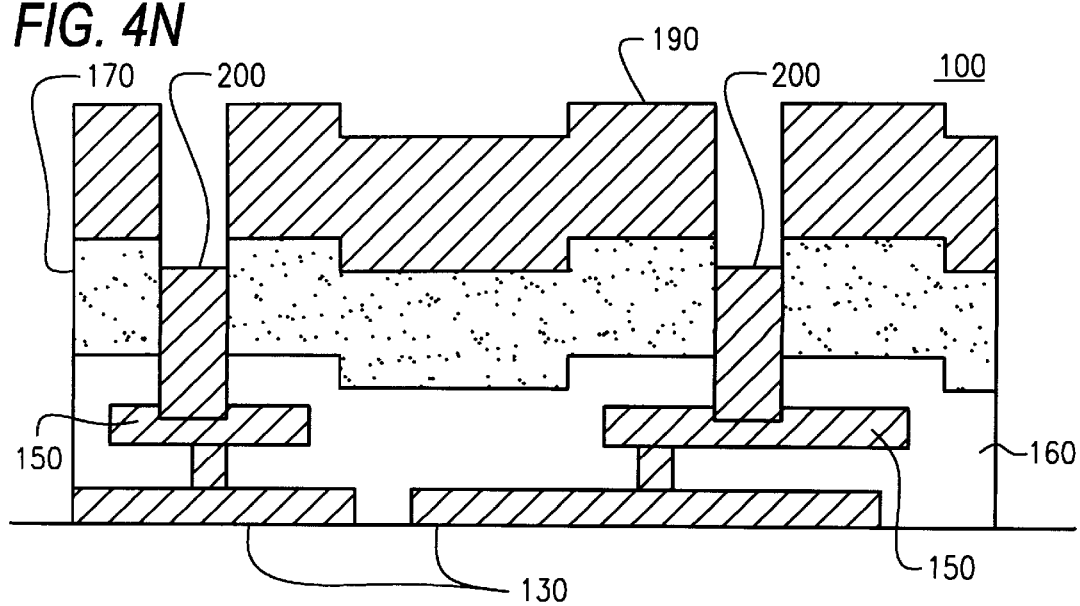
Figure 4O:
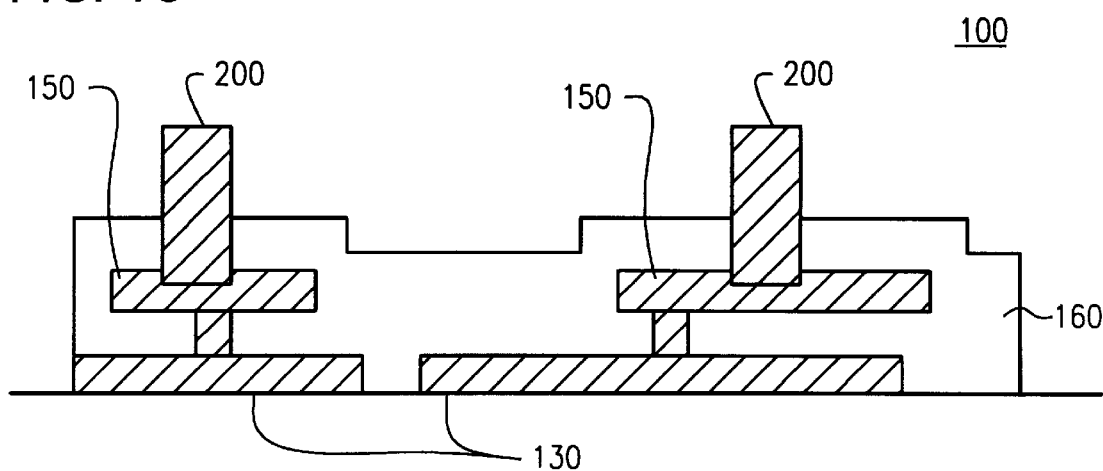
Figure 4P:
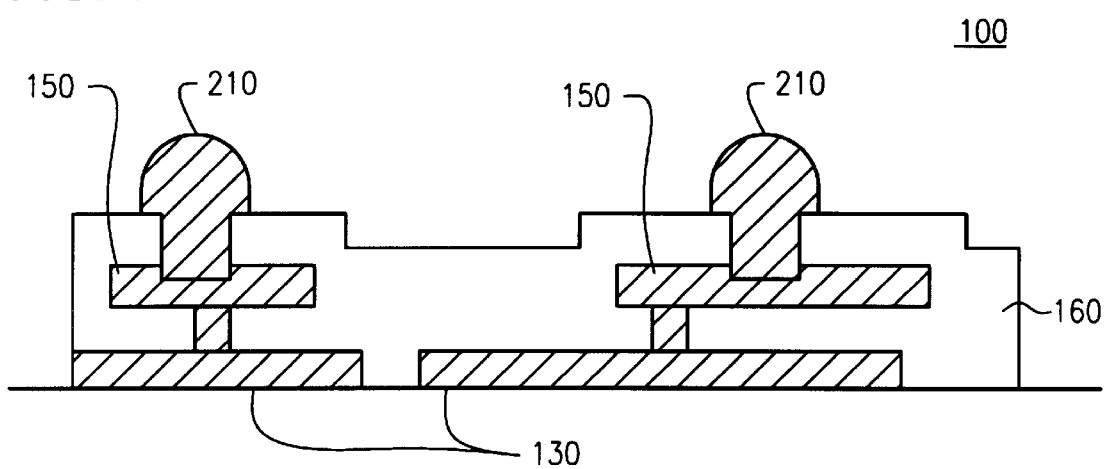
Figure 4Q:
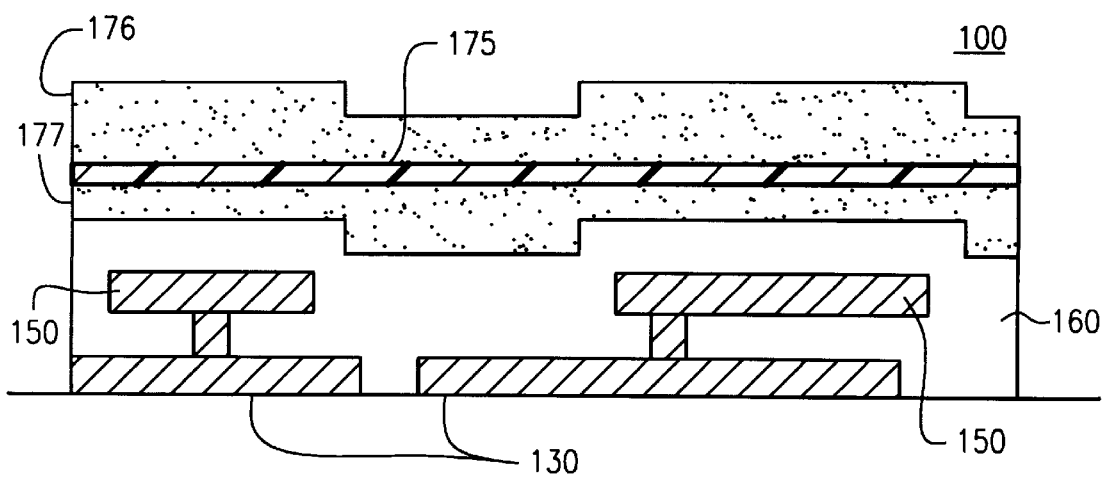

FIGS. 4A–4Q illustrate the inventive process steps used to create micro solder balls on an IC wafer 110. FIG. 4A shows the first stage in the formation of the micro solder balls on the wafer 110. At this stage, an insulating layer 120, such as silicon dioxide ($SiO_2$), is deposited on the next to last layer of metallurgy 130 of the wafer 110 by a process such as chemical vapor deposition (CVD). Although CVD silicon dioxide is preferred for the first insulating layer, other insulators (e.g., polyimide, silicon nitride, flourinated silicon dioxide) known to those skilled in the art may also be used, and deposited by conventional techniques. The insulating layer 120 should be applied so that its thickness is at least 2 microns greater than the thickness of the next to last metal layer 130. Then, the structure 100 is planarized using a chemical mechanical polishing process (CMP). The resulting device, after polishing, is as shown in FIG. 4B, where the excess insulating material has been smoothed away.

Next, as shown in FIG. 4C, a first layer of photoresist 125 is deposited over the insulating layer 120. This photoresist layer 125 may be made of any type of photoresist known to those skilled in the art. The photoresist layer 125 is patterned and exposed to create via holes 140, as shown in FIG. 4D. The via holes 140 are then used to etch into and remove portions of the insulating layer 120. FIG. 4E shows the device after the photoresist layer 125 has been exposed, the via holes 140 have been etched, and the photoresist layer 125 has been removed. These via holes 140 provide a connection for upper conductive levels to the next to last layer of metallurgy 130.

Next, solderable metal pads 150 are formed on the upper surface of the insulating layer 120. This is accomplished by depositing a second photoresist layer 145 on the planarized insulating layer 120, which will be used as a first liftoff layer. FIG. 4F shows the device 100 after the photoresist layer 145 has been placed over the insulating layer 120. An insulator such as polyimide may also be used in place of the photoresist layer 145, but it has been found that photoresist provides the best results in the present invention. This photoresist layer 145 should be approximately 1.5 microns thick. After it is deposited, the photoresist layer 145 is patterned and etched down to the insulating layer 120 leaving exposed those areas on layer 120 where the metal pads 150 are desired, as shown in FIG. 4G. Then, a metal stack consisting of Zirconium (Zr), Nickel (Ni), Copper (Cu), and Gold (Au) is formed overtop of the entire device 100 including over the remaining areas of photoresist layer 145 and in the etched areas. This stack is formed by applying the four different metals, one at a time. Such a process is known in the art and described in U.S. Pat. Nos. 5,719,090 and 5,457,345, both to Cook et al., which are incorporated herein by reference. The Gold layer is optional in the metal stack, but provides excellent protection against oxidation. The thicknesses of each layer of metal is preferably approximately: 500 Angstroms of Zr, 750 Angstroms of Ni, 5000 Angstroms of Cu, and 750 Angstroms of Au, although these thicknesses are not critical. These metal layers are deposited to form metal stacks 150 in the etched areas of the photoresist layer 145, and to form excess metal stacks 150' on top of the photoresist layer 145.

Since the photoresist layer 145 and the metal layers 150, 150' are applied over the entire surface of the device 100, it is necessary to remove the unwanted metal 150' and photoresist 145 prior to the next process step. FIG. 4H shows the device 100 after all metal layers have been deposited. The excess metal areas 150' which lie overtop of the photoresist layer 145, must now be removed. This is accomplished by a liftoff process. Liftoff processes are a well known method for removing unwanted portions of a device under fabrication. The present inventor has found that a tape-assisted liftoff process is especially beneficial in the disclosed process. The tape utilized is an adhesive-backed polymer, which is applied overtop of the entire metallized resist layer, so that it contacts metal stacks 150'. The tape bonds to the metal stacks 150', which is, in turn, bonded to the photoresist layer 145. The removal of the tape causes all of the metal 150' and photoresist 145 to be stripped away, leaving metal pads 150 in only those areas which were previously etched in the photoresist layer 145. The resulting device 100 after the tape liftoff appears as shown in FIG. 4I.

After the metal pads 150 have been formed, a second insulating layer 160 is added overtop of the device 100, as shown in FIG. 4J. This insulating layer 160 can be formed of conventional insulating material, such as polyimide, and should be approximately 1.5 microns thick. Although polyimide is preferred for this layer, any insulator known to those skilled in the art may be used (e.g., silicon dioxide, silicon nitride, flourinated silicon dioxide).

FIG. 4K shows the next step where a third photoresist layer 170 is deposited for use as a second liftoff layer. This photoresist layer 170 can be a continuous layer of photoresist as shown in FIG. 4K, or can alternatively comprise a 'hard mask' layer. The 'hard mask' design is shown in FIG. 4Q, where a 500 Angstrom layer of silicon nitride ($Si_3N_4$) 175 is sandwiched between two photoresist layers 176 and 177. The upper most photoresist layer will be approximately 0.5 microns thick, with the underlying photoresist layer being thick enough so that the entire stack (i.e. layers 175–177) is thicker than the layer of solder which will be subsequently deposited. In the embodiment described herein, the lower level of photoresist 177 is approximately 0.5 microns thick. When using the continuous photoresist layer shown in FIG. 4K, the photoresist must be at least as thick as the layer of solder which will be subsequently applied (i.e. approximately 3 microns). When using the 'hard mask', however, the photoresist layers 176, 177 need not be that thick, as long as the entire stack is thicker than layer of solder to be applied. Although photoresist has been found by the inventor to provide the best results, the second photoresist layer 170 may alternatively comprise a peelaway insulator, such as photosensitive polyimide.

As shown in FIG. 4L, the second photoresist layer 170 is exposed and patterned to produce through holes 180 in the areas above the metal pads 150. Then, the insulator 160 is etched through the holes 180 so that the metal pads 150 are exposed, as shown in FIG. 4M.

Next, as shown in FIG. 4N, a layer of solder 190 is deposited over the entire device 100. The solder should be deposited so that it is at least 2.33 microns thick. This process produces solder contacts 200 in the through holes 180. The photoresist layer 170 and the solder layer 190 are removed using the tape liftoff process described above with reference to photoresist layer 145. The solder layer 190 and the photoresist layer 170 are lifted away from the insulating layer 160 by an adhesive tape which is applied overtop of the solder layer 190. The tape is an adhesive backed polymer which is applied to the solder layer 190 and subsequently stripped off to remove the unwanted solder 190 and photoresist 170 layers. Since the solder layer 190 will bond to the photoresist layer 170, the stripping action causes both layers (i.e. 170 and 190) to be removed simultaneously.

FIG. 4O shows the device 100 after the unwanted photoresist and solder have been removed. Solder contacts 200 which connect with metal pads 150 now project out of the top surface of insulating layer 160. In the final step, the solder contacts 200 are heated to allow them to reflow. When the solder contacts 200 are reflowed they form solder ball contacts 210 having a shape similar to that shown in FIG. 4P. These solder ball contacts 210 are composite contacts, including both the flat contact portion and the solder ball portion in a single unit.

In an alternate embodiment of the the present invention, a single liftoff procedure is used to form both the metal pads 150 and the solder ball contacts 200, instead of the multiple liftoff procedure descibed above. This embodiment is useful where only contact pads are to be formed in the last metal layer 130 (i.e. the pad metallurgy). This alternate process will now be explained with reference to FIGS. 4(E) and 5(A–E).

Figure 5A:
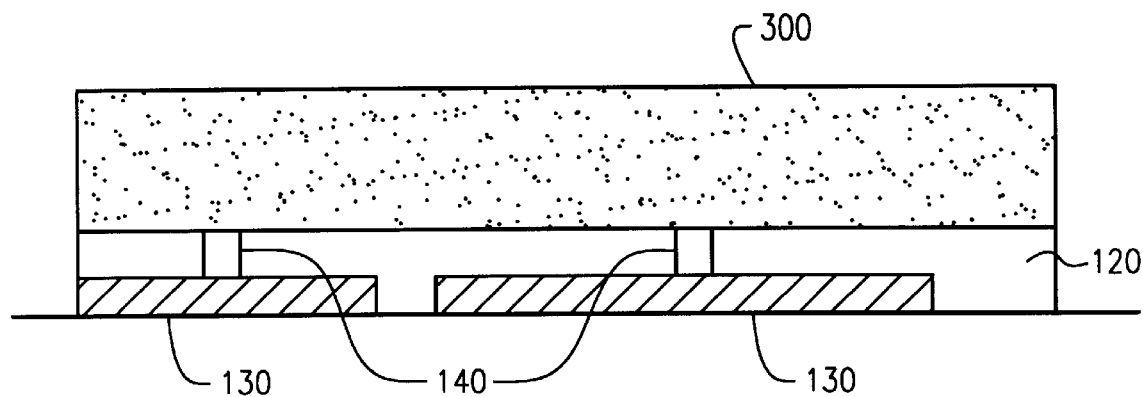
FIGS. 5A–5E show cross-sectional views of a structure fabricated in accordance with another method of the present invention.
Figure 5B:
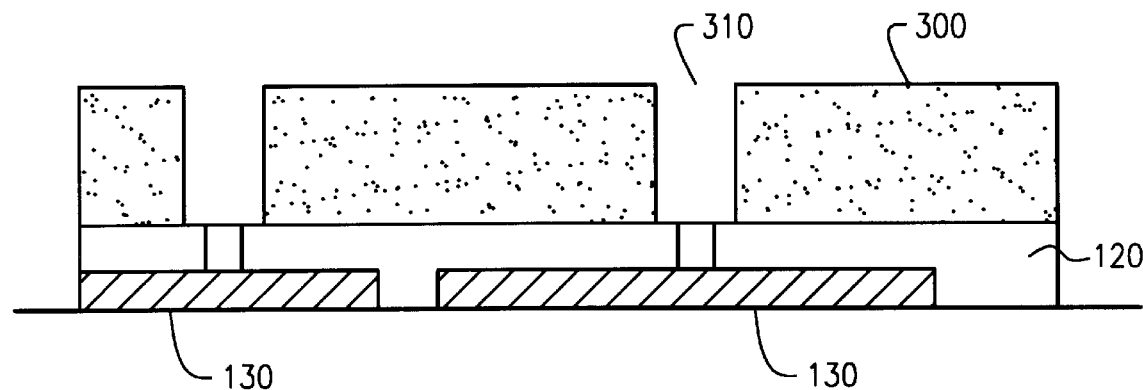
Figure 5C:
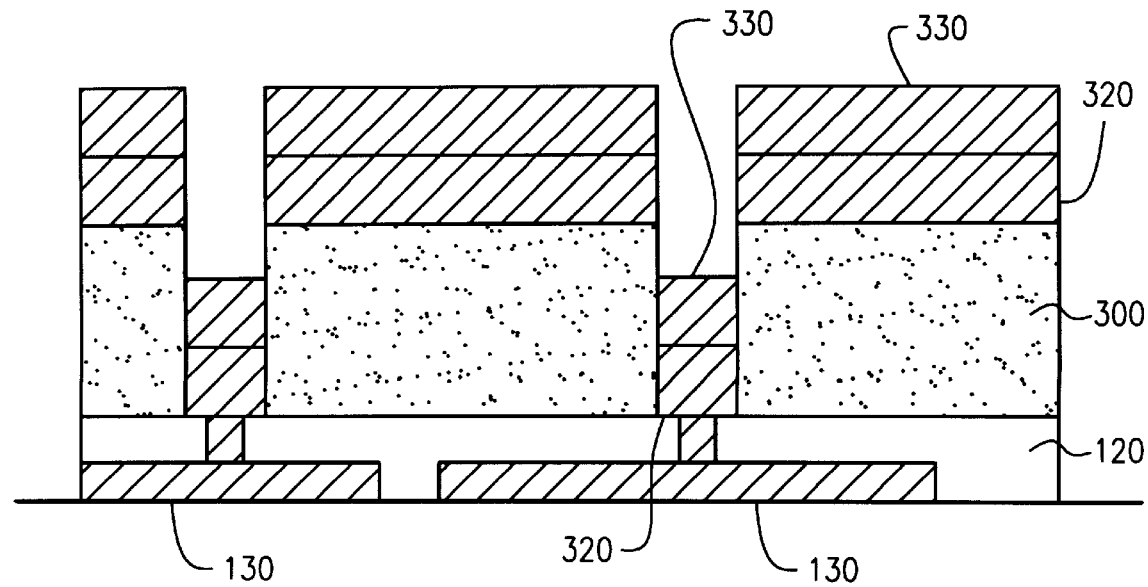
Figure 5D:
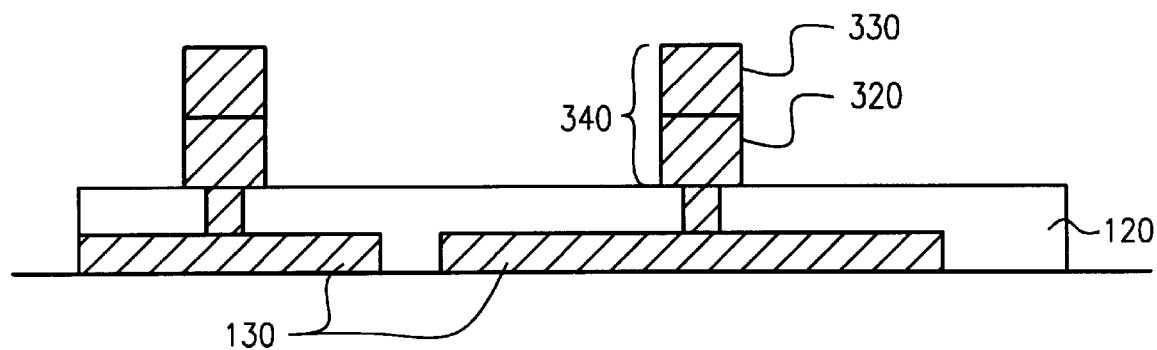
Figure 5E:
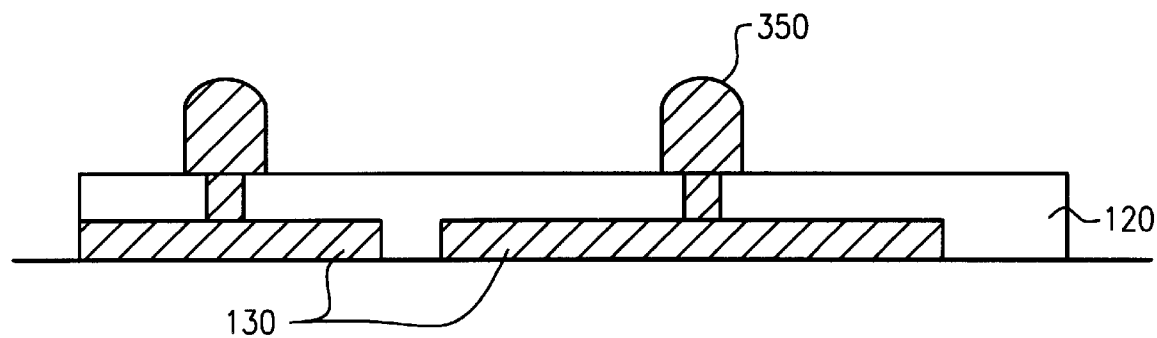

After step 4(E), instead of depositing a photoresist layer 145 (shown in FIG. 4(F)), a thicker photoresist layer 300 is applied overtop of the entire surface of the device 100 (See FIG. 5(A)). Then, as shown in FIG. 5(B), holes 310 are formed in the photoresist 300. These holes 310 are selected according to the desired size of the solder ball contact (i.e. the larger the holes 310, the larger the diameter of the solder ball contact). As shown in FIG. 5(C), the metal pads 320 (150 in FIG. 4(H)) and the solder ball contacts 330 (200 in FIG. 4(O)) are deposited in the holes 310 formed in the photoresist 300 in a single step. First, the metal pads 320 comprising the layers of Zr, Ni, Cu, and Au are deposited by the process described above with reference to FIG. 4(H). Then, a layer of solder 330 is deposited. The ensuing liftoff process remove all the excess solder and pad metal to create a device like the one shown in FIG. 5(D). The stack 340 which is formed is a composite stack, with the four-layer metal pad on the bottom and solder on the top. The entire stack 340 is then reflowed to form the solder ball contacts 350 shown in FIG. 5(E).

Because these solder ball contacts in the invention are formed by deposition of solder through fine closely spaced holes in a photoresist layer and by using a tape liftoff process, rather than a metal mask process, the size of the contacts is decreased significantly. Solder contacts formed using the above process are approximately 2 microns in diameter. This is a significant improvement over prior art solder ball contacts, which are currently 100 microns in diameter. Although the above process can be used to form solder contacts which are approximately 2 microns in diameter, it can also be used by those skilled in the art to produce solder contacts of any size, but particularly those in the range of 2 microns to 100 microns. For example, it might be desirable to form solder contacts of 10, 25, 50 or 75 microns, or any other size in the range of 2 to 100 microns, or in a narrower range such as less than 50 microns, or less than 25 microns, or less than 10 microns, as non-limiting examples.

Figure 1:
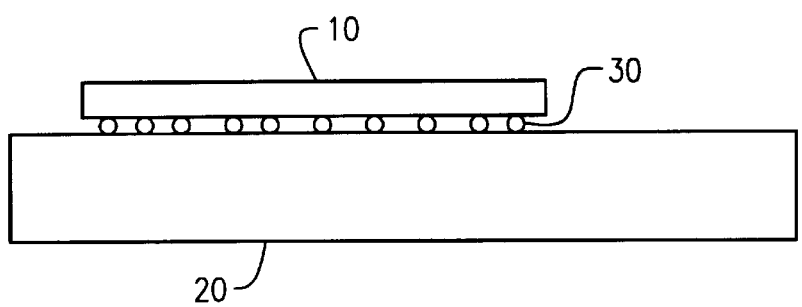
FIG. 1 shows a cross-sectional view of a prior art integrated circuit package before C4 bonds are created.
Figure 2:
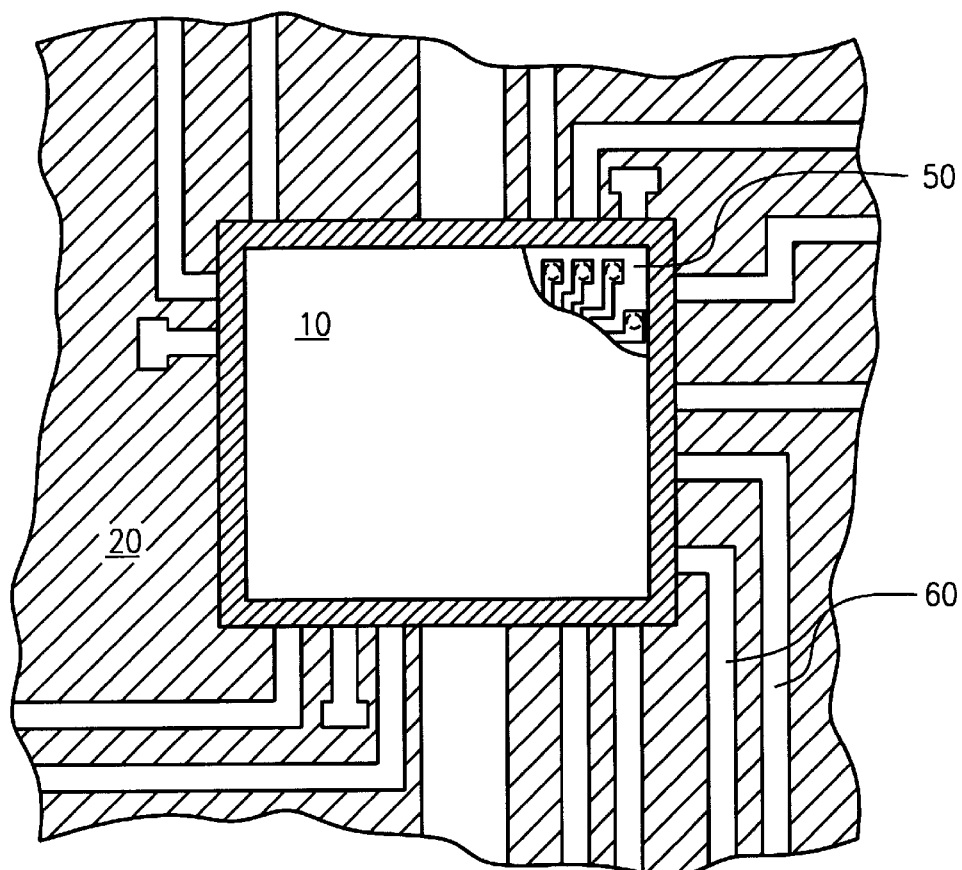
FIG. 2 shows a top view of a prior art integrated circuit package before C4 bonds are created.
Figure 3:
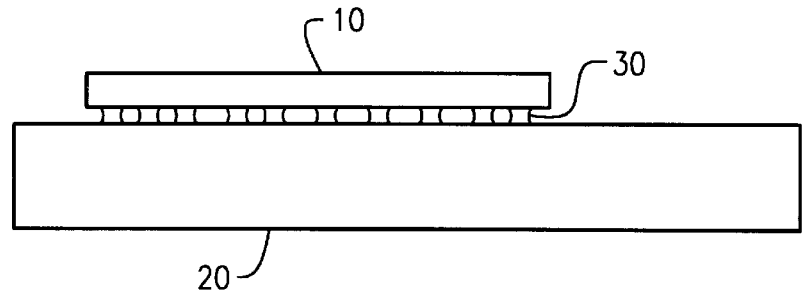
FIG. 3 shows a cross-sectional view of a prior art integrated circuit package after the C4 bonds are created.

When producing multiple chips on a wafer, the wafer can be diced, after the solder ball contacts 210 are formed over the entire wafer, to create a multitude of chips with solder ball contacts 210. These individual chips can then be attached to a module substrate or circuit board using the C4 process described above with reference to FIGS. 1–3.

While the invention has been described and illustrated with respect to forming solder contacts on an integrated circuit chip, it should be apparent that the same processing techniques can be used to form solder contacts on a module substrate, a printed circuit board or other conductor bearing substrate.

Moreover, it should be readily understood that the invention is not limited to the specific embodiments described and illustrated above. Rather, the invention can be modified to incorporate any number of variations, alterations, substitutions or equivalent arrangements not heretofore described, which are commensurate with the spirit and scope of the invention. Accordingly, the invention is not limited by the foregoing description, but is only limited by the scope of the appended claims.

What is claimed is:

1. A method for forming solder areas on electrical contacts of a device, said method comprising the steps of:

depositing a photoresist layer on a surface of said device containing said contacts;

forming respective holes in the photoresist layer to said contacts;

applying a solder layer on top of the photoresist layer and in the holes to form solder areas in the holes which contact with said contacts; and, simultaneously removing the solder layer on top of the photoresist layer and the photoresist layer using a tape liftoff process while leaving the solder areas on the contacts, wherein the tape liftoff process comprises applying an adhesive tape overtop of the solder layer, and stripping away the tape to simultaneously remove the solder layer and the photoresist layer while leaving the solder areas on the contacts.

2. The method of claim 1, wherein the solder areas are reflowed to form solder ball contacts.

3. The method of claim 1, wherein said device is an integrated circuit wafer and the surface is the surface of said wafer.

4. The method of claim 1, wherein said device is an integrated circuit and the surface is the surface of said integrated circuit.

5. The method of claim 1, wherein said device is a circuit board and the surface is the surface of said circuit board.

6. The method of claim 1, wherein said device is a module substrate and the surface is the surface of said module substrate.

7. A process for forming a solder area on a semiconductor device comprising the steps of:

depositing a first insulating layer on at least one metal contact on a surface of said semiconductor device;

forming at least one first hole in the first insulating layer so that the at least one metal contact is exposed;

depositing metal in said at least one first hole and on top of the insulating layer to form at least one metal pad on the surface of the insulating layer;

depositing a second insulating layer over said device including over said at least one metal pad;

depositing a photoresist layer over said second insulating layer;

forming at least one second hole in the second insulating layer and the photoresist layer to expose said at least one metal pad;

applying a solder layer over the photoresist layer and in the at least one second hole to form at least one solder area in the second hole which is in contact with said at least one metal pad; and, simultaneously removing the photoresist layer and solder layer from the device using a tape liftoff process while leaving the solder area in contact with said at least one metal pad, wherein the tape liftoff process comprises applying an adhesive tape overtop of the solder layer, and stripping away the tape to simultaneously remove the solder layer and the photoresist layer while leaving the solder area in contact with said at least one metal pad.

8. The process of claim 7, wherein the second insulating layer is polyimide.

9. The process of claim 7, wherein the first insulating layer is silicon dioxide.

10. The process of claim 7, wherein the photoresist layer is at least 2 microns thick.

11. The process of claim 7, wherein the first insulating layer is planarized before the at least one first hole is formed.

12. The process of claim 7, wherein the metal pad comprises a metal stack comprising four different metal levels.

13. The process of claim 12, wherein the metal levels comprise Zirconium, Nickel, Copper and Gold.

14. The process of claim 7, wherein said photoresist layer comprises a thin layer of silicon nitride interposed between an upper layer and a lower layer of photoresist.

15. The process of claim 7, wherein the first insulating layer is polished by chemical mechanical polishing before the at least one first hole is formed.

16. The process of claim 7, wherein the at least one first hole is formed in the first insulating layer by a photoresist etch process.

17. The process of claim 7, wherein at least one portion of the second insulating layer is removed prior to the application of the solder layer.

18. The process of claim 17, wherein the at least one second hole is formed in the photoresist layer above the area in the second insulating layer which has been removed.

19. The process of claim 7, wherein the first insulating layer is at least 2 microns thicker than the at least one metal contact.

20. The process of claim 13, wherein the Zirconium layer is at least 500 Angstroms thick.

21. The process of claim 13, wherein the Nickel layer is at least 750 Angstroms thick.

22. The process of claim 13, wherein the Copper layer is at least 5000 Angstroms thick.

23. The process of claim 13, wherein the Gold layer is at least 750 Angstroms thick.

24. The process of claim 14, wherein the silicon nitride layer is at least 500 Angstroms thick, and the upper and lower layers of photoresist are at least 0.5 microns thick.

25. The process of claim 7, wherein the solder layer applied is at least 2.33 microns thick.

26. The process of claim 7, wherein the solder area has a diameter less than 100 microns.

27. The process of claim 7, wherein the solder area has a diameter less than 50 microns.

28. The process of claim 7, wherein the solder area has a diameter less than 25 microns.

29. The process of claim 7, wherein the solder area has a diameter less than 10 microns.

30. The process of claim 7, wherein the solder area has a diameter approximately 2 microns.

31. The process of claim 7, wherein the solder area is reflowed to form a solder contact.

32. The process of claim 7, wherein said semiconductor device is an integrated circuit wafer.

33. The process of claim 7, wherein said semiconductor device is an integrated circuit.

34. A method for forming a solder area on a semiconductor device comprising the steps of:

depositing an insulating layer over at least one metal pad formed on the semiconductor device;

depositing a photoresist layer over said insulating layer;

forming at least one hole in the insulating layer and the photoresist layer to expose said at least one metal pad;

applying a solder layer over the photoresist layer and in the at least one hole to from at least one solder area in the hole; and, simultaneously removing the photoresist layer and solder layer using a tape liftoff process while leaving the solder area on the metal pad, wherein the tape liftoff process comprises applying an adhesive tape overtop of the solder layer, and stripping away the tape to simultaneously remove the solder layer and the photoresist layer while leaving the solder area on the metal pad.

35. A method for forming solder areas on electrical contacts present at a surface of an electrical device, said method comprising the steps of:

depositing a liftoff layer on said surface;

forming respective holes in the liftoff layer to expose said contacts;

applying a solder layer on top of the liftoff laver and in the holes to form solder areas in the holes which are in contact with respective ones of said electrical contacts; and, removing the solder layer and liftoff layer using a tape liftoff process while leaving the solder areas, wherein the tape liftoff process comprises applying an adhesive tape overtop of the solder layer, and stripping away the tape to simultaneously remove the solder layer and the liftoff layer while leaving the solder areas.

36. The method of claim 35, wherein the liftoff layer comprises an insulating layer.

37. The method of claim 36, wherein the insulating layer is a polyimide layer which can be peeled away.

38. The method of claim 35, wherein the electrical device is an integrated circuit chip.

39. The method of claim 35, wherein the electrical device is an integrated circuit wafer.

40. The method of claim 35, wherein the electrical device is a circuit board.

41. The method of claim 35, wherein the electrical device is a module substrate.

42. The method of claim 35, wherein the liftoff layer is photoresist layer.

43. A method of forming contact pads and solder areas on an electrical device comprising the steps of:

depositing a photoresist layer on the surface of an electrical device containing vias;

forming respective holes in the photoresist aligned with said vias;

applying a layer of contact metal to form contacts in the vias and in the holes overlying said vias;

applying a layer of solder to form solder areas on top of the contacts in the holes over said vias;

simultaneously removing the solder and the contact metal which lies on top of the photoresist layer using a tape liftoff process, while leaving the solder areas and contacts which lie overtop of the vias, wherein the tape liftoff process comprises applying an adhesive tape overtop of the solder, and stripping away the tape to simultaneously remove the solder, contact metal and the photoresist layer while leaving the solder areas and contacts which lie overtop the vias.

44. The method of claim 43, wherein the solder areas and contacts are reflowed to form solder ball contacts.

45. The method of claim 43, wherein the electrical device is an integrated circuit.

46. The method of claim 43, wherein the electrical device is a circuit board.

47. The method of claim 43, wherein the electrical device is a module substrate.

* * * * *